(12) United States Patent
Ikeda (10) Patent No.: US 11,322,448 B2
(45) Date of Patent: May 3, 2022

(54) ELECTRONIC MODULE

(71) Applicant: SHINDENGEN ELECTRIC MANUFACTURING CO., LTD., Tokyo (JP)

(72) Inventor: Kosuke Ikeda, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 40 days.

(21) Appl. No.: 16/961,628

(22) PCT Filed: Jan. 17, 2018

(86) PCT No.: PCT/JP2018/001164
§ 371 (c)(1),
(2) Date: Jul. 10, 2020

(87) PCT Pub. No.: WO2019/142253
PCT Pub. Date: Jul. 25, 2019

(65) Prior Publication Data
US 2020/0343189 A1  Oct. 29, 2020

(51) Int. Cl.
*H01L 23/538* (2006.01)
*H01L 25/065* (2006.01)

(52) U.S. Cl.
CPC ...... *H01L 23/5386* (2013.01); *H01L 23/5385* (2013.01); *H01L 25/065* (2013.01)

(58) Field of Classification Search
CPC ......... H01L 24/37; H01L 24/35; H01L 24/82; H01L 24/97; H01L 23/5385
See application file for complete search history.

(56) References Cited

U.S. PATENT DOCUMENTS

| 2008/0079505 | A1 | 4/2008 | Kuroda |
| 2017/0092568 | A1 | 3/2017 | Ikeda |
| 2017/0311482 | A1 | 10/2017 | Ikeda et al. |
| 2017/0317015 | A1* | 11/2017 | Lee .......................... H01L 24/41 |

FOREIGN PATENT DOCUMENTS

| JP | H04345083 A | 12/1992 |
| JP | H11195858 A | 7/1999 |
| JP | 2006237276 A | 9/2006 |
| JP | 2008078164 A | 4/2008 |

(Continued)

OTHER PUBLICATIONS

International Search Report in the international application No. PCT/JP2018/001164, dated Mar. 27, 2018, and its English translation provided by WIPO.

(Continued)

*Primary Examiner* — Hoa B Trinh
(74) *Attorney, Agent, or Firm* — Ladas & Parry, LLP (57) ABSTRACT

An electronic module has a first substrate 11; a second substrate 21 provided in one side of the first substrate 11; and a chip module 100 provided between the first substrate 11 and the second substrate 21. The chip module 100 has an electronic element 13, 23 and a connecting body 60, 70, 80 electrically connected to the electronic element 13, 23. The electronic element 13, 23 extends along a first direction that is a thickness direction of the electronic module.

9 Claims, 7 Drawing Sheets

(56) References Cited

FOREIGN PATENT DOCUMENTS

| | | | |
|---|---|---|---|
| JP | 2008085744 A | 4/2008 | |
| JP | 2010124607 A | 6/2010 | |
| JP | 2013012642 A | 1/2013 | |
| WO | 2013172183 A1 | 11/2013 | |
| WO | 2016067383 A1 | 5/2016 | |
| WO | WO2016/067659 * | 5/2016 | ............ H01L 23/36 |
| WO | 2016174698 A1 | 11/2016 | |

OTHER PUBLICATIONS

Written Opinion of the international application No. PCT/JP2018/001164, dated Mar. 27, 2018, and its English translation provided by Google Translate.

* cited by examiner

FIG. 1

FIRST DIRECTION

SECOND DIRECTION

ELECTRONIC MODULE

CROSS-REFERENCE TO RELATED APPLICATION

The present application is the U.S. national phase of PCT Application No. PCT/JP2018/001164 filed on Jan. 17, 2018, the disclosure of which is incorporated herein by reference in its entirety

TECHNICAL FIELD

The present invention relates to an electronic module having a substrate and an electronic element.

BACKGROUND

An electronic module is conventionally known in which a plurality of electronic elements are provided in a sealing resin. Downsizing is desired for such an electronic module.

As a solution for downsizing, it is conceivable to adopt an aspect in which electronic elements are stacked in layers. As such an aspect, WO 2016/067383 A is known. However, in WO 2016/067383 A, it is only proposed that semiconductor elements included in the electronic element are provided on two substrates facing each other, and only a stack structure is disclosed in which the semiconductor elements are stacked in the thickness direction.

In WO 2016/174698 A, a semiconductor module is proposed, which has a first member having a first insulating substrate, a first conductor layer provided on a mounting surface of the first insulating substrate, a first power device provided in the first conductor layer, and a first connecting part connected to the first power device; a second member having a second insulating substrate, a second conductor layer provided on a mounting surface of the second insulating substrate, a second power device provided in the second conductor layer, and a second connecting part connected to the second power device; and a conductor pillar extending in the top-bottom direction between the first member and the second member. In this aspect, an aspect is also proposed in which the first power device and the second power device are arranged to face each other, and connected to each other by the conductor pillar; however, still, only a stack structure is disclosed in which the power devices are stacked in the thickness direction of the semiconductor module.

SUMMARY

Problem Resolved by Invention

The present invention proposes mounting an electronic element in an aspect different from a conventional aspect, and provides an electronic module in which the degree of freedom in design is increased.

Means to Resolve Problem

[Concept 1]
An electronic module may comprise:
a first substrate;
a second substrate provided in one side of the first substrate; and
a chip module provided between the first substrate and the second substrate, wherein the chip module may have an electronic element and a connecting body electrically connected to the electronic element, and
the electronic element may extend along a first direction that is a thickness direction of the electronic module.

[Concept 2]
In the electronic module according to concept 1,
the chip module may have a first electronic element and a second electronic element connected to the first electronic element via the connecting body.

[Concept 3]
In the electronic module according to concept 1 or 2,
the connecting body may have a first connecting body and a second connecting body, and
the chip module may have a first electronic element, a second electronic element, the first connecting body provided between the first electronic element and the second electronic element, and the second connecting body provided in an opposite side of the second electronic element from the first connecting body.

[Concept 4]
In the electronic module according to any one of concepts 1 to 3,
the connecting body may have a head part and a pillar part extending from the head part in a thickness direction of the head part and
the head part may extend in the thickness direction of the electronic module.

[Concept 5]
In the electronic module according to any one of concepts 1 to 4,
a plurality of chip modules may be provided, and
a chip connecting body electrically connected to the chip modules may be provided between the chip modules.

[Concept 6]
In the electronic module according to concept 5,
a chip module may have a fitting part to be fitted to the chip connecting body.

[Concept 7]
The electronic module according to any one of concepts 1 to 6 may further comprise:
a first conductor layer provided in one side of the first substrate; and
a second conductor layer provided in another side of the second substrate; wherein
the connecting body may have a connection terminal connecting the electronic element to each of the first conductor layer and the second conductor layer, and
either one of the first conductor layer and the second conductor layer connected to the connection terminal may not be electrically connected to an external device.

[Concept 8]
The electronic module according to any one of concepts 1 to 7 may further comprise:
a first conductor layer provided in one side of the first substrate; and
a second conductor layer provided in another side of the second substrate, wherein
the connecting body may have a head part, a first base end part extending from an end part of the head part along an in-plane direction of the first substrate and connected to the first conductor layer, and a second base end part extending from an end part of the head part along an in-plane direction of the second substrate and connected to the second conductor layer, and
a direction in which the first base end part extends from an end of the head part and a direction in which the second base end part extends from an end of the head part may not overlap in an in-plane direction of the electronic module including a second direction and a third direction.

[Concept 9]

In the electronic module according to concept 8, the direction in which the first base end part extends from the end of the head part and the direction in which the second base end part extends from the end of the head part may be different by 180 degrees.

In the present invention, when the aspect is adopted in which the electronic elements provided to the connecting bodies extend along the direction from the first substrate to the second substrate, the electronic elements can be arranged to extend in a direction different from that of a conventional configuration, and the degree of freedom in design can be increased compared to the configuration conventionally proposed.

DETAILED DESCRIPTION

First Embodiment

<<Structure>>

Figure 1:
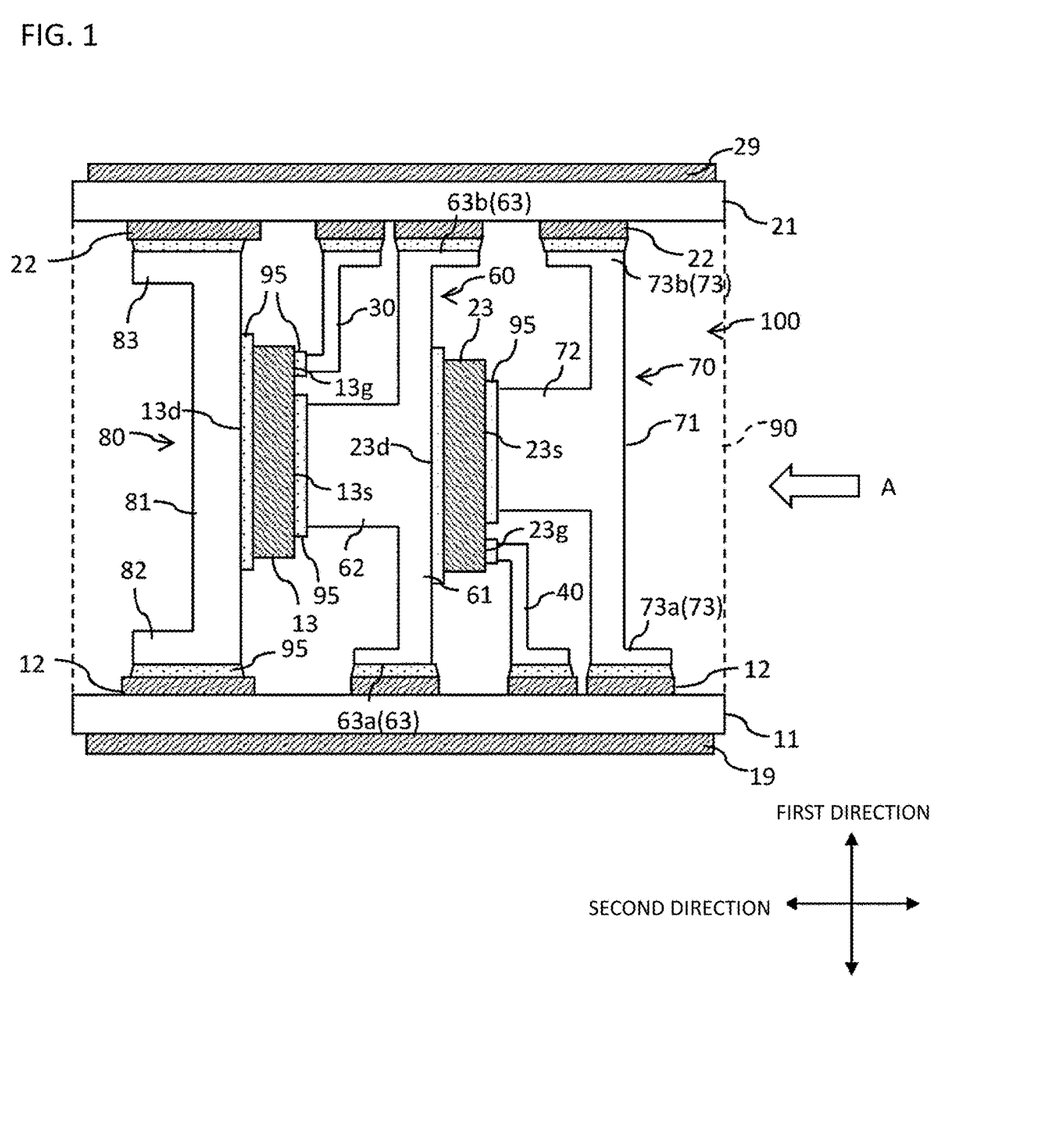
FIG. 1 is a side cross-sectional view of an electronic module that can be used in a first embodiment of the present invention.

In the present embodiment, the term "one side" refers to the upper side in FIG. 1, and the term "other side" refers to the lower side in FIG. 1. The top-bottom direction and left-right direction of FIG. 1 are referred to as a "first direction" and "second direction" respectively, and the front-rear direction of the sheet is referred to as a "third direction". The in-plane direction including the second and third directions is referred to as a "in-plane direction" and the term "plan view" is used for a view taken from one side.

As shown in FIG. 1, an electronic module may have a first substrate 11, a second substrate 21 provided in one side of the first substrate 11, and a chip module 100 provided between the first substrate 11 and the second substrate 21. The chip module 100 may have electronic elements 13 and 23, and connecting bodies 60, 70, and 80 electrically connected to the electronic elements 13 and 23. The electronic elements 13 and 23 may extend in the thickness direction of the electronic module, that is, in the first direction. Extending in the "thickness direction" (that is, the "first direction") of the electronic module includes not only an aspect of extending along the normal direction (first direction) of the first substrate 11 but also an aspect of extending obliquely with respect to the normal direction of the first substrate 11. The electronic elements 13 and 23 each have a substantially rectangular parallelepiped shape with a small thickness, for example. A direction in which each of the electronic elements 13 and 23 extends is a direction orthogonal to the thickness direction (a direction from the front surface to the back surface of each of the electronic elements 13 and 23, and a direction from the back surface to the front surface of each of the electronic elements 13 and 23).

The chip module 100 may have a first electronic element 13, and a second electronic element 23 connected to the first electronic element 13 via the connecting bodies 60, 70, and 80. The chip module 100 of the present embodiment may be assembled prior to manufacturing of the electronic module. When such an aspect is adopted, it is only necessary to place the chip module 100 appropriately during assembly of the electronic module, so that the manufacturing efficiency can be greatly increased.

The connecting bodies 60, 70, and 80 may have a first connecting body 60 and a second connecting body 70. In this case, the chip module 100 may have the first electronic element 13, the second electronic element 23, the first connecting body 60 provided between the first electronic element 13 and the second electronic element 23, and the second connecting body 70 provided in the opposite side of the second electronic element 23 from the first connecting body 60.

The connecting bodies 60, 70, and 80 may have head parts 61 and 71, and pillar parts 62 and 72 extending from the head parts 61 and 71 in the thickness direction of the head parts 61 and 71. The head parts 61 and 71 may each extend in the thickness direction of the electronic module. In the aspect shown in FIG. 1, the thickness direction of each of the head parts 61 and 71 is the second direction. In the aspect in which the connecting bodies 60, 70, and 80 have the first connecting body 60 and the second connecting body 70, the first connecting body 60 may have a first head part 61, and a first pillar part 62 extending from the first head part 61 in the thickness direction of the first head part 61. In addition, the second connecting body 70 may have a second head part 71, and a second pillar part 72 extending from the second head part 71 in the thickness direction of the second head part 71.

One or a plurality of first conductor layers 12 may be provided on one side of the first substrate 11. One or a plurality of second conductor layers 22 may be provided on the other side of the second substrate 21. Both or either one of the first electronic element 13 and the second electronic element 23 may be a switching element or a control element. As the switching element, a MOSFET, an IGBT, or the like may be used. Each of the first electronic element 13 and the second electronic element 23 may be composed of a semiconductor element, and the semiconductor material may be silicon, silicon carbide, gallium nitride, or the like.

A conductive adhesive 95 such as solder may be provided between the first electronic element 13 and the first connecting body 60, and the first electronic element 13 and the first connecting body 60 may be connected to each other via the conductive adhesive 95. Similarly, the conductive adhesive 95 such as solder may be provided between the first connecting body 60 and the second electronic element 23, and the first connecting body 60 and the second electronic element 23 may be connected to each other via the conductive adhesive 95. Similarly, the conductive adhesive 95 such as solder may be provided between the second electronic element 23 and the second connecting body 70, and the second electronic element 23 and the second connecting body 70 may be connected to each other via the conductive adhesive 95.

A first heat radiation layer 19 made of a metal such as copper may be provided on the other side of the first substrate 11. Similarly, a second heat radiation layer 29 made of a metal such as copper may be provided on one side of the second substrate 21.

As the first substrate 11 and the second substrate 21, a ceramic substrate, an insulating resin layer, or the like can be adopted. As the conductive adhesive 95, in addition to solder, a material can be used containing Ag or Cu as a main component. As the material of the first connecting body 60 and the second connecting body 70, a metal can be used such as Cu. Note that, as the substrates 11 and 21, for example, a metal substrate can also be used subjected to circuit patterning, and in this case, the substrates 11 and 21 also serve as the conductor layers 12 and 22, respectively.

The electronic module may have a sealing part 90 composed of a sealing resin and the like that seals the first electronic element 13, the second electronic element 23, the first connecting body 60, the second connecting body 70, the first conductor layer 12, the second conductor layer 22, and the like.

Figure 4:
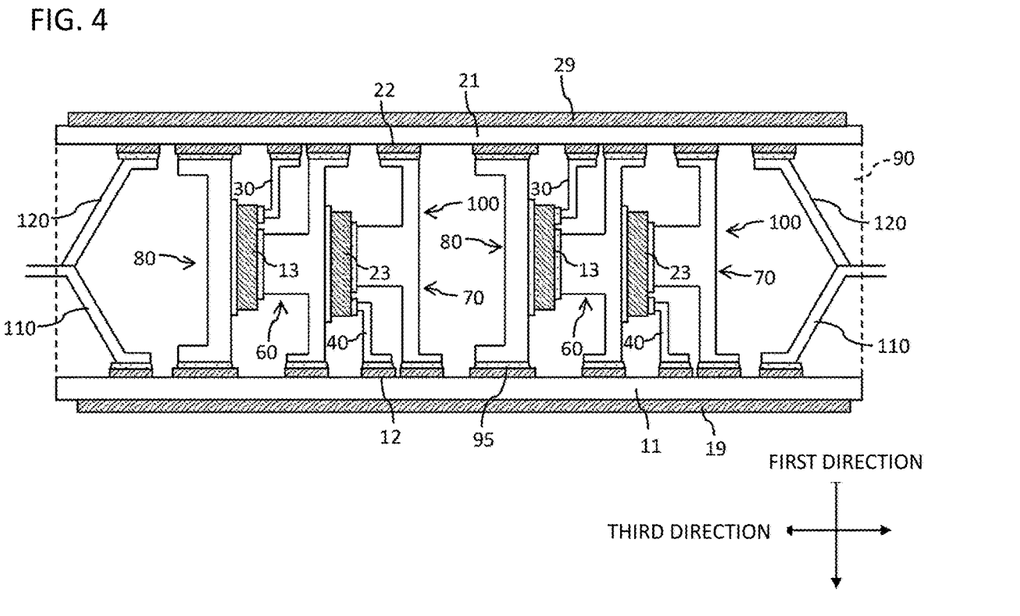
FIG. 4 is a side cross-sectional view of an electronic module that can be used in a second embodiment of the present invention.

The electronic module may have terminals 110 and 120 for connecting an external device to the electronic elements 13 and 23 (see FIG. 4). The terminals 110 and 120 may have a first terminal 110 connected to the first conductor layer 12, and a second terminal 120 connected to the second conductor layer 22.

When the first electronic element 13 is a switching element such as a MOSFET, a first gate electrode 13g and a first source electrode 13s may be provided on the surface on the first connecting body 60 side (surface on the right side in FIG. 1). Similarly, when the second electronic element 23 is a switching element such as a MOSFET, a second gate electrode 23g and a second source electrode 23s are provided on the surface on the second connecting body 70 side (surface on the right side in FIG. 1). In this case, the second connecting body 70 may be connected to the second source electrode 23s of the second electronic element 23 via the conductive adhesive 95. In addition, the first connecting body 60 may connect the first source electrode 13s of the first electronic element 13 via the conductive adhesive 95 to a second drain electrode 23d provided on the opposite surface of the second electronic element 23 from the second connecting body 70 (surface on the left side in FIG. 1). A first drain electrode 13d may be provided on the opposite surface of the first electronic element 13 from the first connecting body 60 (surface on the left side in FIG. 1). The first gate electrode 13g may be connected to a first connector 30 via the conductive adhesive 95, and the first connector 30 may be connected to the conductor layers 12 and 22 (the second conductor layer 22 in FIG. 1) via the conductive adhesive 95. The second gate electrode 23g may be connected to a second connector 40 via the conductive adhesive 95, and the second connector 40 may be connected to the conductor layers 12 and 22 (the first conductor layer 12 in FIG. 1) via the conductive adhesive 95.

Bonding of the terminals 110 and 120 to the conductor layers 12 and 22 is not limited to the aspect using the conductive adhesive 95 such as solder, but laser welding or ultrasonic bonding may be used.

The connecting bodies 60, 70, and 80 may have a connection terminal 80 connecting the electronic elements 13 and 23 to each of the first conductor layer 12 and the second conductor layer 22. Either one of the first conductor layer 12 and the second conductor layer 22 connected to the connection terminal 80 does not have to be electrically connected to the external device.

When the connection terminal 80 is provided as in the present embodiment, it is also possible to radiate heat even through the connection terminal 80. In the aspect shown in FIG. 1, the connection terminal 80 is provided on the opposite surface of the first electronic element 13 from the surface on which the first connecting body 60 is provided. For this reason, in this aspect, heat from the first electronic element 13 can be radiated by the connection terminal 80.

The connection terminal 80 may have: a terminal head part 81 extending in the thickness direction (the first direction in FIG. 1) of the electronic module; a first base end part 82 extending from an end part of the terminal head part 81 along the in-plane direction (the second direction in FIG. 1) of the first substrate 11 and connected to the first conductor layer 12; and a second base end part 83 extending from an end part of the terminal head part 81 along the in-plane direction of the second substrate 21 and connected to the second conductor layer 22. By providing the first base end part 82 and the second base end part 83 as described above, connections to the first conductor layer 12 and the second conductor layer 22 can be made more reliable, and the heat radiation effect can also be increased.

The first connecting body 60 may have a first connecting body base end part 63 provided at an end part of the first head part 61 and connected to the first conductor layer 12 or the second conductor layer 22. The first connecting body base end part 63 may have: a first base end part 63a extending from an end part of the first head part 61 along the in-plane direction (the second direction in FIG. 1) of the first substrate 11 and connected to the first conductor layer 12; and a second base end part 63b extending from an end part of the first head part 61 along the in-plane direction of the second substrate 21 and connected to the second conductor layer 22.

The second connecting body 70 may have a second connecting body base end part 73 provided at an end part of the second head part 71 and connected to the first conductor layer 12 or the second conductor layer 22. The second connecting body base end part 73 may have: a first base end part 73a extending from an end part of the second head part 71 along the in-plane direction (the second direction in FIG. 1) of the first substrate 11 and connected to the first conductor layer 12; and a second base end part 73b extending from an end part of the second head part 71 along the in-plane direction of the second substrate 21 and connected to the second conductor layer 22.

In the aspect shown in FIG. 1, a direction in a plane in which the first base end part 82 extends from the end part of the terminal head part 81 and a direction in a plane in which the second base end part 83 extends from the end part of the terminal head part 81 are the same direction with each other (the left direction in FIG. 1). However, this is not a limitation, and the direction in the plane in which the first base end part 82 extends from the end part of the terminal head part 81 and the direction in the plane in which the second base end part 83 extends from the end part of the terminal head part 81 may be different directions from each other (for example, directions different by 180 degrees).

<<Functions and Effects>>

Next, an example will be described of functions and effects by the present embodiment having the above-described configuration. Note that, any of aspects to be described in the "Functions and Effects" can be adopted in the above configuration.

In the present embodiment, when the aspect is adopted in which the electronic elements 13 and 23 provided to the connecting bodies 60, 70, and 80 extend along the direction from the first substrate 11 to the second substrate 21, the electronic elements 13 and 23 can be arranged to extend in a direction different from that of a conventional configuration, and the degree of freedom in design can be increased compared to the configuration conventionally proposed.

In the present embodiment, when the chip module 100 has the aspect having the first electronic element 13, and the second electronic element 23 connected to the first electronic element 13 via the first connecting body 60, the chip module 100 can be used in which the first electronic element 13 and the second electronic element 23 are connected to each other via the first connecting body 60. For this reason, for example, the first source electrode 13s of the first electronic element 13 and the second drain electrode 23d of the second electronic element 23 are electrically connected to each other by the first connecting body 60, or the first drain electrode 13d of the first electronic element 13 and the second source electrode 23s of the second electronic element 23 are electrically connected to each other by the first connecting body 60, and these can be used as one chip module 100.

When the aspect is used in which the chip module 100 has the first electronic element 13, the second electronic element 23, the first connecting body 60 provided between the first electronic element 13 and the second electronic element 23, and the second connecting body 70 provided in the opposite side of the second electronic element 23 from the first connecting body 60, the chip module 100 can be used in which the first electronic element 13 and the second electronic element 23 are connected to each other via the first connecting body 60 and that has the second connecting body 70 connected to the second electronic element 23. For this reason, for example, the aspect is adopted in which the first source electrode 13s of the first electronic element 13 and the second drain electrode 23d of the second electronic element 23 are electrically connected to each other by the first connecting body 60 and the second source electrode 23s of the second electronic element 23 is connected by the second connecting body 70, or the aspect is adopted in which the first drain electrode 13d of the first electronic element 13 and the second source electrode 23s of the second electronic element 23 are electrically connected to each other by the first connecting body 60 and the second drain electrode 23d of the second electronic element 23 is connected by the second connecting body 70, and these can be used as one chip module 100.

When the aspect is adopted in which the connecting bodies 60, 70, and 80 have the head parts 61 and 71, and the pillar parts 62 and 72 extending from the head parts 61 and 71 in the thickness direction of the head parts 61 and 71, heat from the electronic elements 13 and 23 can be prevented from being caught. When the aspect is adopted in which the first connecting body 60 has the first pillar part 62, a predetermined distance or greater can be provided between the first electronic element 13 and the second electronic element 23, and heat from the first electronic element 13 and heat from the second electronic element 23 can be prevented from being caught. In addition, when the aspect is adopted in which the second connecting body 70 has the second pillar part 72, heat from the second electronic element 23 is transmitted to the first conductor layer 12 or the second conductor layer 22 with a distance from the second electronic element 23, so that the heat from the second electronic element 23 can be prevented from being caught. In particular, when the aspect is adopted in which the electronic elements 13 and 23 extend along the direction from the first substrate 11 to the second substrate 21 as in the present embodiment, it is beneficial from the viewpoint of heat radiation that the predetermined distance or greater can be provided between the first electronic element 13 and the second electronic element 23 as described above.

When the direction in the plane in which the first base end parts 63a, 73a, and 82 extend and the direction in the plane in which the second base end parts 63b, 73b, and 83 extend are different directions from each other, the heat flow directions in the in-plane direction of the electronic module can be made different from each other, and it can be expected that the heat radiation effect can be increased. From this viewpoint, the aspect is beneficial in which the direction in the plane in which the first base end parts 63a, 73a, and 82 extend and the direction in the plane in which the second base end parts 63b, 73b, and 83 extend are different directions from each other by 180 degrees. In particular, when the aspect is adopted in which the electronic elements 13 and 23 extend along the direction from the first substrate 11 to the second substrate 21 as in the present embodiment, since heat is easy to be caught, it is very beneficial to increase the heat radiation effect as described above.

Figure 2:
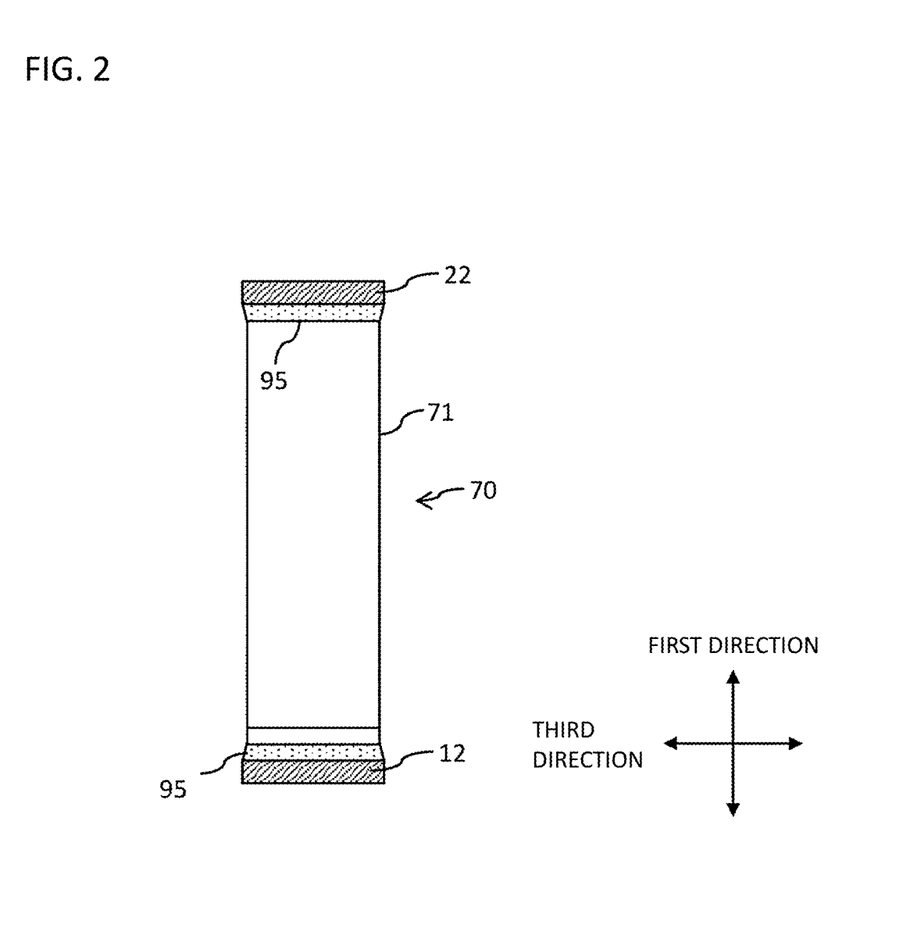
FIG. 2 is a side view of a second connecting body viewed from an arrow A in FIG. 1.
Figure 3:
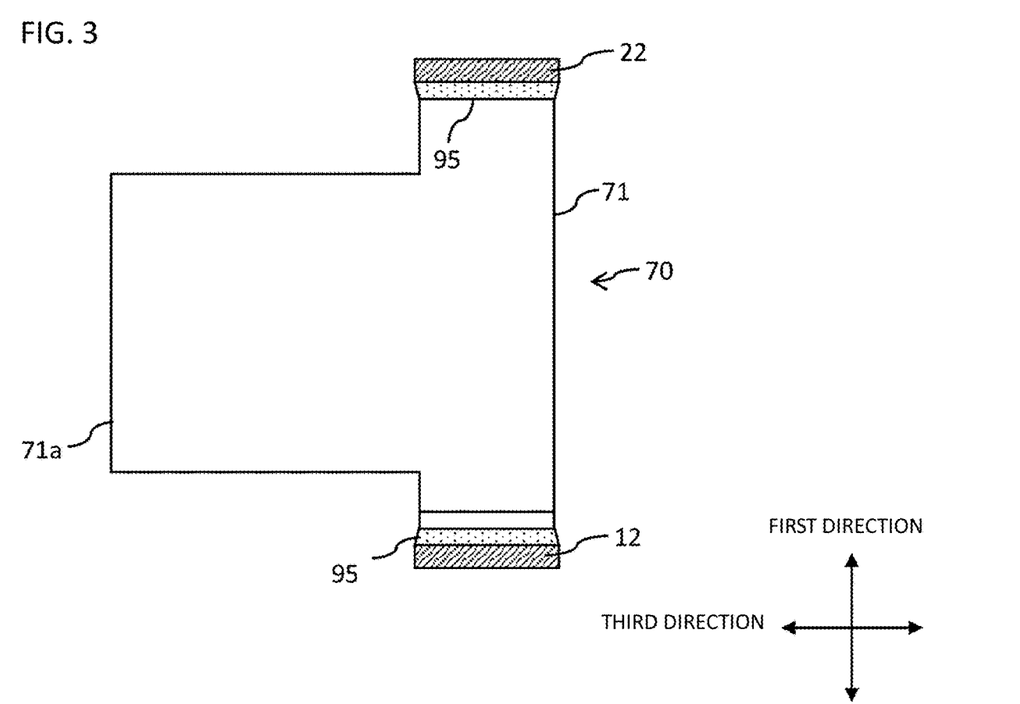
FIG. 3 is a side view of a second connecting body that has an aspect different from the aspect shown in FIG. 2.

The connecting bodies 60 and 70 each may have an elongated rectangular shape when viewed from the side as shown in FIG. 2 (in FIG. 2, a case is shown where it is seen from the direction of an arrow A in FIG. 1). However, this is not a limitation, and the connecting bodies 60 and 70 may be provided with a protruding surface 71a when viewed from the side, as shown in FIG. 3. FIGS. 2 and 3 show the configuration of the second connecting body 70, and the first connecting body 60 may also have the same configuration as the second connecting body 70 shown in FIGS. 2 and 3.

Second Embodiment

Next, a second embodiment of the present invention will be described.

Figure 5:
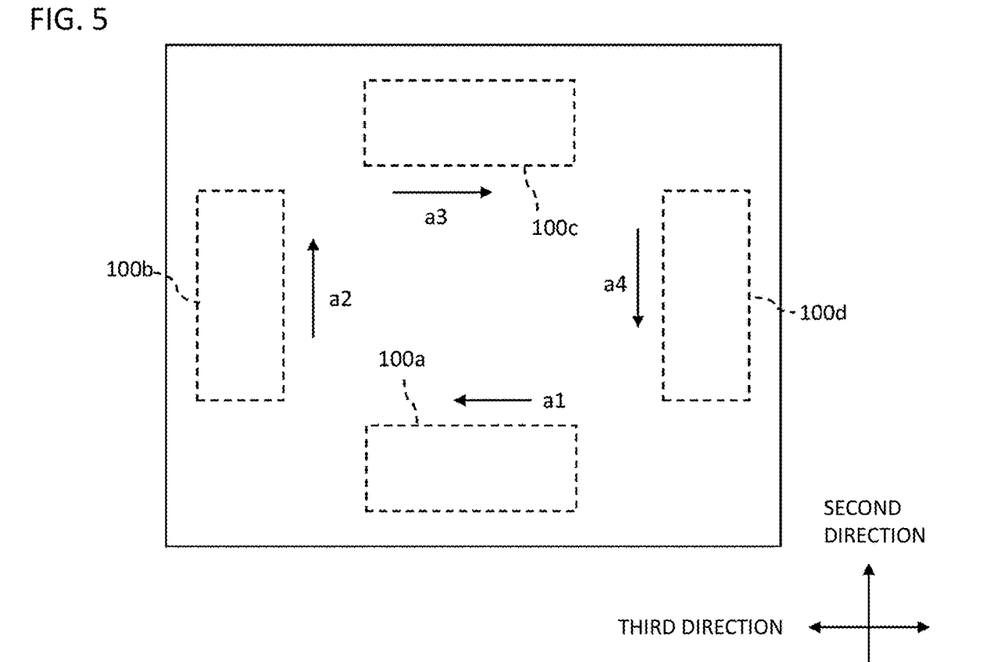
FIG. 5 is a plan view of the electronic module that can be used in the second embodiment of the present invention.
Figure 6:
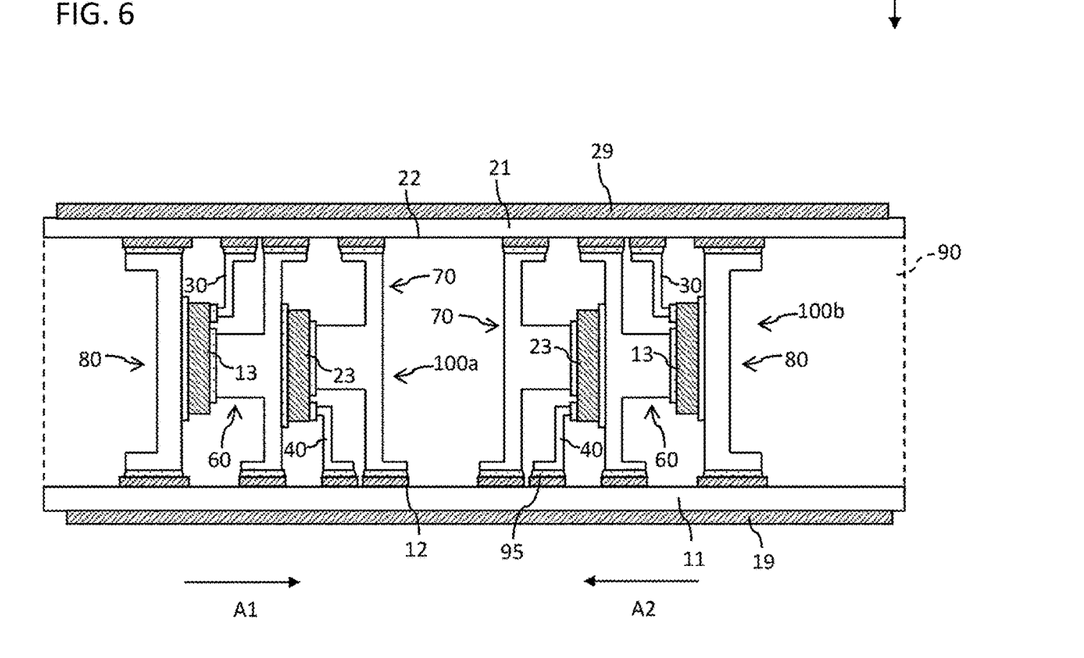
FIG. 6 is a side cross-sectional view of an electronic module that can be used in the second embodiment of the present invention and has an aspect different from the aspect shown in FIG. 4.

In the present embodiment, as shown in FIGS. 4 to 6, a plurality of chip modules 100 are provided. In the present embodiment, any of the aspects described in the first embodiment can be adopted. The same reference numerals will be used to describe the members described in the first embodiment.

When the plurality of chip modules 100 is provided as in the present embodiment, in each chip module 100, the first electronic element 13 and the second electronic element 23 may be provided to extend in the thickness direction (first direction) of the electronic module.

An arrangement direction of the chip module 100 can be appropriately adjusted. If a direction from the first electronic element 13 to the second electronic element 23 (left-right direction in FIG. 4) is defined as the thickness direction of the chip module 100, the thickness direction of one chip module 100 and the thickness direction of the other chip module 100 may be different directions from each other. For example, as shown in FIG. 5, the thickness direction of a certain chip module 100a (for example, a first chip module 100a described later) and the thickness direction of another chip module 100b (for example, a second chip module 100b described later) may be orthogonal to each other in the in-plane direction (the in-plane direction including the second direction and the third direction) of the electronic module. In addition, as shown in FIG. 6, the direction from the first electronic element 13 to the second electronic element 23 in the certain chip module 100a (see an arrow A1 in FIG. 6) and the direction from the first electronic element 13 to the second electronic element 23 in the other chip module 100b (see an arrow A2 in FIG. 6) may be different directions from each other by 180 degrees.

For example, as shown in FIG. 5, when the aspect is adopted in which the first chip module 100a, the second chip module 100b, a third chip module 100c, and a fourth chip module 100d are provided, two or more of the thickness direction of the first chip module 100a, the thickness direction of the second chip module 100b, the thickness direction of the third chip module 100c, and the thickness direction of the fourth chip module 100d may be different directions from each other. As an example, as shown in FIG. 5, the thickness direction of the first chip module 100a and the thickness direction of the third chip module 100c may coincide with each other, and the thickness direction of the second chip module 100b and the thickness direction of the fourth chip module 100d may coincide with each other. In addition, as shown in FIG. 5, the thickness directions of the first chip module 100a and the third chip module 100c, and the thickness directions of the second chip module 100b and the fourth chip module 100d may be orthogonal to each other in the in-plane direction of the electronic module. In addition, the direction from the first electronic element 13 to the second electronic element 23 in the first chip module 100a (see an arrow a1 in FIG. 5) and the direction from the first electronic element 13 to the second electronic element 23 in the third chip module 100c (see an arrow a3 in FIG. 5) may be different directions from each other by 180 degrees, and similarly, the direction from the first electronic element 13 to the second electronic element 23 in the second chip module 100b (see an arrow a2 in FIG. 5) and the direction from the first electronic element 13 to the second electronic element 23 in the fourth chip module 100d (see an arrow a4 in FIG. 5) may be different directions from each other by 180 degrees.

Third Embodiment

Next, a third embodiment of the present invention will be described.

Figure 7:
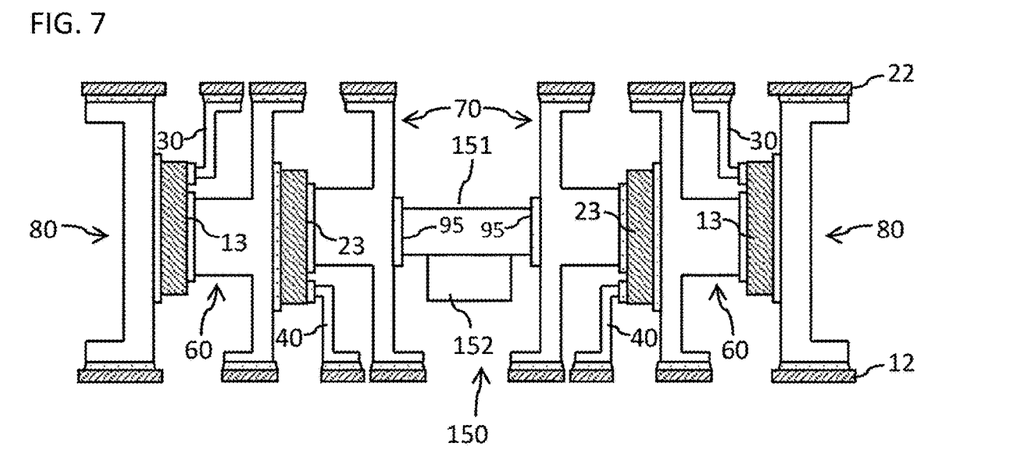
FIG. 7 is a side cross-sectional view of an electronic module that can be used in a third embodiment of the present invention and in which some members such as a sealing part are not shown.

In the present embodiment, as in the second embodiment, a plurality of chip modules 100 are provided. As shown in FIG. 7, between the chip modules 100 in the in-plane direction of the electronic module (the in-plane direction including the second direction and the third direction), a chip connecting body 150 is provided as a third connecting body electrically connected to the chip modules 100. In the present embodiment, any of the aspects described in the above embodiments can be adopted. The same reference numerals will be used to describe the members described in the above embodiments.

According to the present embodiment, the chip connecting body 150 electrically connected to the chip modules 100 is provided between the chip modules 100 in the in-plane direction of the electronic module, so that two or more chip modules 100 can be electrically connected to each other via the chip connecting body 150. For this reason, the plurality of chip modules 100 can be used as one block (module).

Three or more chip modules 100 may be provided around the chip connecting body 150 in the in-plane direction of the electronic module, and these three or more chip modules 100 may be electrically connected to each other by the chip connecting body 150. When this aspect is adopted, three or more chip modules 100 can be used as one block (module).

The chip connecting body 150 may have a third head part 151 extending in the in-plane direction of the electronic module, and a third pillar part 152 extending from the third head part 151 to the other side.

Fourth Embodiment

Next, a fourth embodiment of the present invention will be described.

Figure 8:
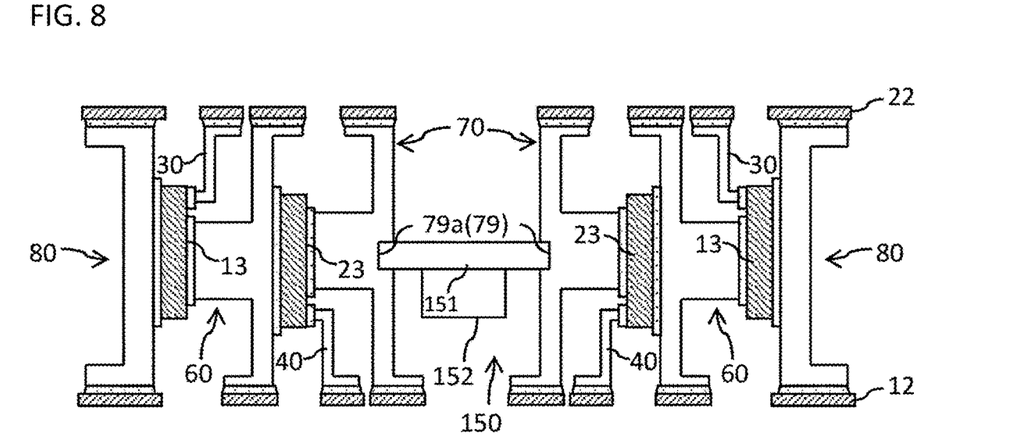
FIG. 8 is a side cross-sectional view of an electronic module that can be used in a fourth embodiment of the present invention and in which some members such as a sealing part are not shown.

In the present embodiment, as shown in FIG. 8, a chip connecting body 150 is provided as in the third embodiment. Each chip module 100 of the present embodiment has a fitting part 79 to be fitted to the chip connecting body 150. Also in the present embodiment, any of the aspects described in the above embodiments can be adopted. The same reference numerals will be used to describe the members described in the above embodiments.

When the fitting part 79 is provided as in the present embodiment, positioning can be reliably performed between the chip module 100 and the chip connecting body 150, and positioning between the plurality of chip modules 100 can also be performed reliably.

The chip module 100 may have a recessed part 79a as the fitting part 79 of the present embodiment. When the recessed part 79a is provided, the peripheral part of the chip connecting body 150 is fitted into the recessed part 79a. In the aspect shown in FIG. 8, as an example, the second head part 71 of the second connecting body 70 has the recessed part 79a.

Figure 9:
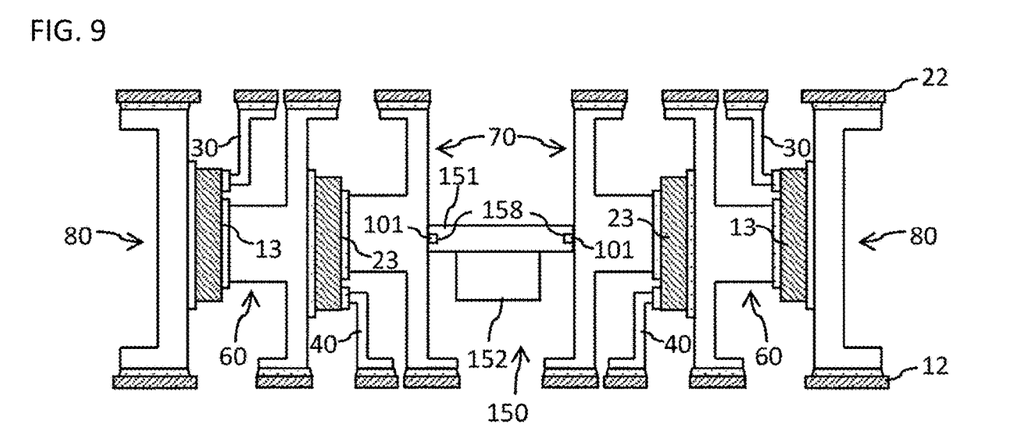
FIG. 9 is a side cross-sectional view of an electronic module that can be used in the fourth embodiment of the present invention and has an aspect different from the aspect shown in FIG. 8 and in which some members such as a sealing part are not shown.

Unlike this aspect, as shown in FIG. 9, the chip module 100 may have a protruding part 101 as a fitting part. When the protruding part 101 is provided, the chip connecting body 150 may be provided with a recessed part 158 for fitting the protruding part 101.

Fifth Embodiment

Next, a fifth embodiment of the present invention will be described.

Figure 10:
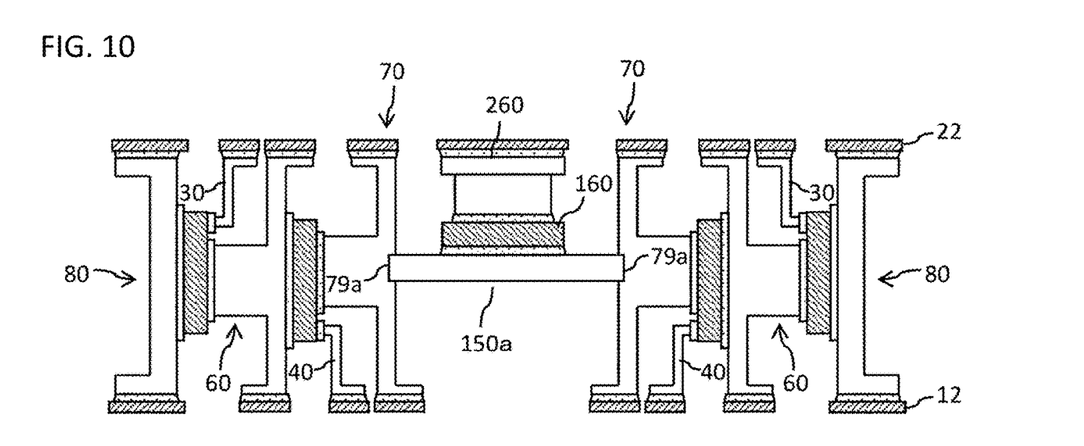
FIG. 10 is a side cross-sectional view of an electronic module that can be used in a fifth embodiment of the present invention and in which some members such as a sealing part are not shown.

Also in the present embodiment, as shown in FIG. 10, a chip connecting body 150a is provided. The chip connecting body 150a of the present embodiment is provided with a first electronic component 160. The first electronic component 160 may be placed on a mounting surface of the chip connecting body 150a via the conductive adhesive 95. Also in the present embodiment, any of the aspects described in the above embodiments can be adopted. The same reference numerals will be used to describe the members described in the above embodiments.

According to the present embodiment, the first electronic element 13 and the second electronic element 23 included in each chip module 100 can be electrically connected to the first electronic component 160 provided on the chip connecting body 150a. As the first electronic component 160, a relay circuit or the like can be used; however, this is not a limitation, and an electronic element such as a semiconductor element may be used.

As shown in FIG. 10, on one side of the first electronic component 160, a fourth connecting body 260 may be provided for connecting the first electronic component 160 to the second conductor layer 22. The conductive adhesive 95 is provided between the fourth connecting body 260 and the first electronic component 160, and the conductive adhesive 95 is also provided between the fourth connecting body 260 and the second conductor layer 22.

When the aspect is adopted as shown in FIG. 10, a sub electronic module having the chip modules 100 and the first electronic component 160 can be used as one block.

As shown in FIG. 10, in the present embodiment, the chip connecting body 150a is used having a plate-like shape; however, this is not a limitation, and the chip connecting body 150 may be used having the third pillar part 152 as shown in FIGS. 7 to 9.

Figure 11:
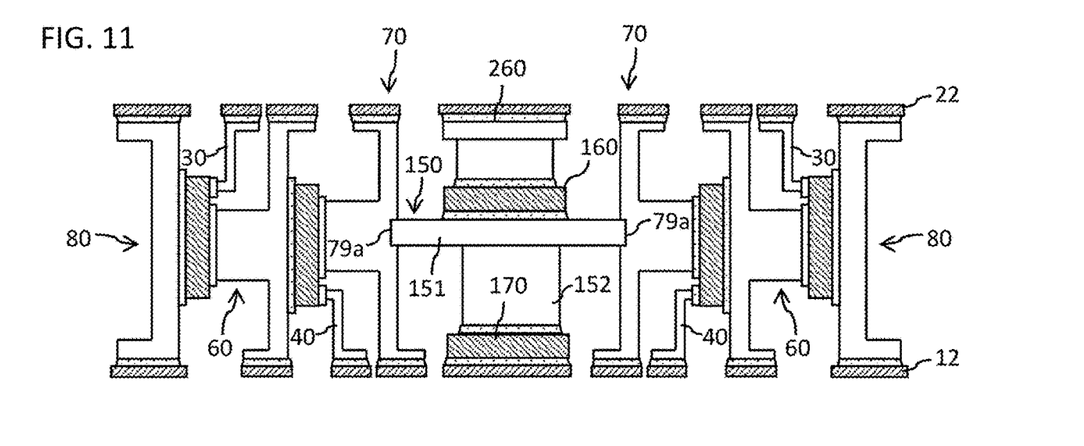
FIG. 11 is a side cross-sectional view of an electronic module that can be used in the fifth embodiment of the present invention and has an aspect different from the aspect shown in FIG. 10 and in which some members such as a sealing part are not shown.

As shown in FIG. 11, a second electronic component 170 may be provided in addition to the first electronic component 160. As the second electronic component 170, a relay circuit or the like can be used; however, this is not a limitation, and an electronic element such as a semiconductor element may be used.

The second electronic component 170 may be positioned on the other side of the third pillar part 152 of the chip connecting body 150, and the first electronic component 160 may be positioned on one side of the third head part 151. In the aspect shown in FIG. 11, the conductive adhesive 95 is provided between the chip connecting body 150 and the second electronic component 170, and the conductive adhesive 95 is also provided between the second electronic component 170 and the second conductor layer 22.

When the aspect is adopted as shown in FIG. 11, a sub electronic module having the chip module 100, the first electronic component 160, and the second electronic component 170 can be used as one block.

Figure 12:
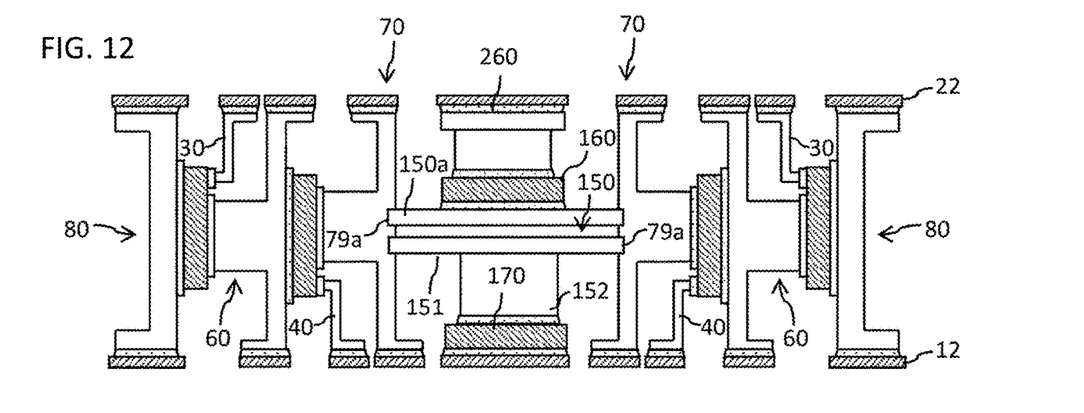
FIG. 12 is a side cross-sectional view of an electronic module that can be used in the fifth embodiment of the present invention and has an aspect different from the aspects shown in FIGS. 10 and 11 and in which some members such as a sealing part are not shown.

As shown in FIG. 12, two or more chip connecting bodies 150 and 150a may be provided. The first electronic component 160 may be provided on one of the chip connecting bodies 150 and 150a, and the second electronic component 170 may be electrically connected to the other. In the aspect shown in FIG. 12, the first electronic component 160 is provided on the chip connecting body 150a, and the chip connecting body 150 and the second electronic component 170 are electrically connected to each other.

Although the fitting part 79 is shown in the aspects shown in FIGS. 10 to 12, the fitting part 79 does not have to be provided. Also in the present embodiment, it is also conceivable to prepare a module in advance as a sub electronic module including the first electronic component 160, the second electronic component 170, or both of the first electronic component 160 and the second electronic component 170 in addition to the first electronic element 13 and the second electronic element 23.

Sixth Embodiment

Next, a sixth embodiment of the present invention will be described.

Figure 13:
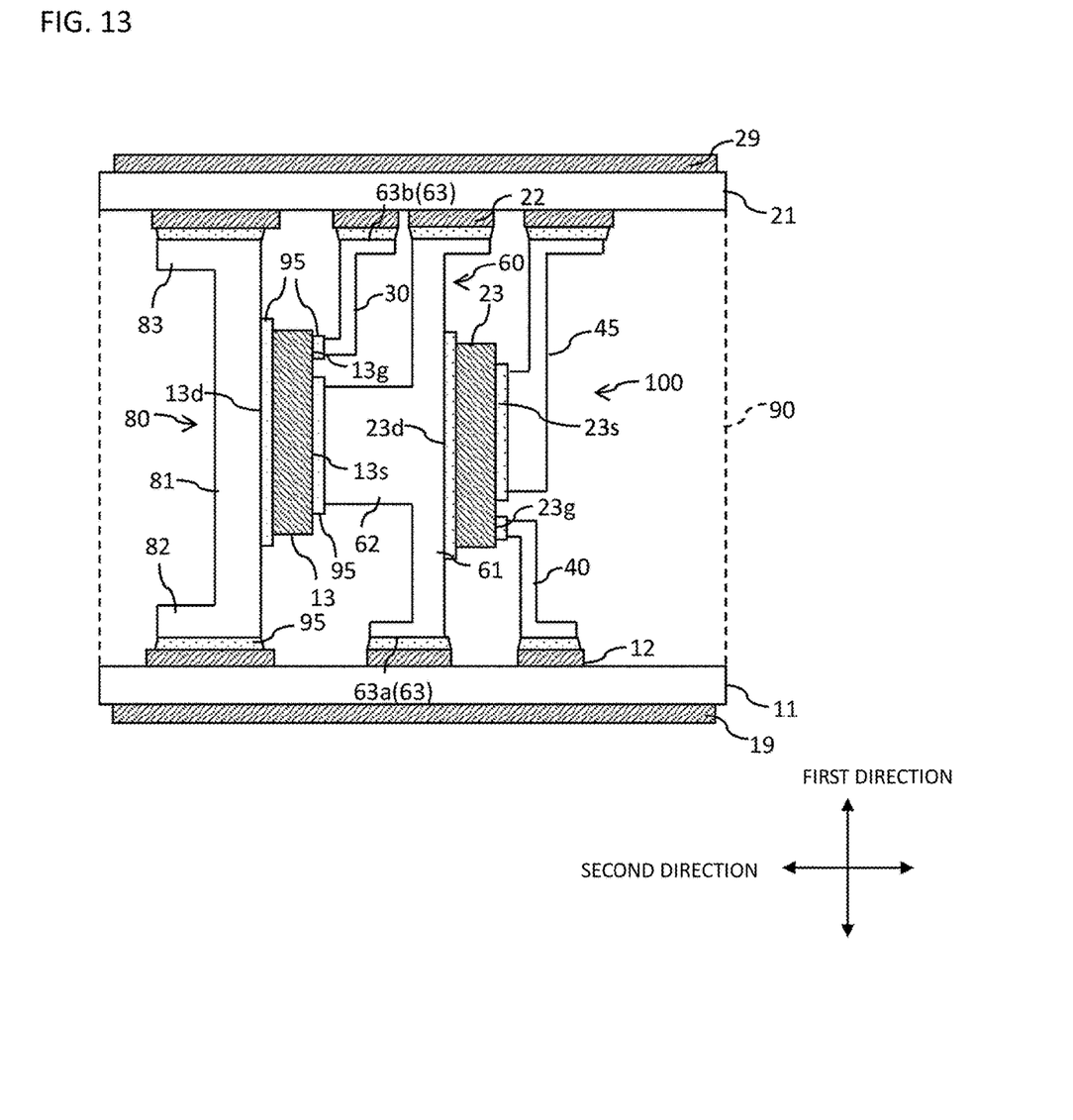
FIG. 13 is a side cross-sectional view of an electronic module that can be used in a sixth embodiment of the present invention.

In each of the above-described embodiments, the description has been made using the aspect in which the second connecting body 70 is used; however, this is not a limitation. As shown in FIG. 13, the second connecting body 70 does not have to be provided. In the present embodiment, a connector 45 is provided instead of the second connecting body 70. Also in the present embodiment, any of the aspects described in the above embodiments can be adopted. The same reference numerals will be used to describe the members described in the above embodiments. Also in the present embodiment, effects can be obtained other than that the second connecting body 70 is not provided.

The disclosures of the descriptions and drawings of the above-described embodiments are merely examples for explaining the inventions described in the claims, and the inventions are not limited by the disclosures of the descriptions or drawings of the above-described embodiments. In addition, the descriptions of the claims at the beginning of the application are merely examples, and the descriptions of the claims can be appropriately changed based on the descriptions of the specification and the drawings.

REFERENCE SIGNS LIST

11 First substrate
13 First electronic element (electronic element)
21 Second substrate
23 Second electronic element (electronic element)
60 First connecting body (connecting body)
61 First head part (head part)
62 First pillar part (pillar part)
70 Second connecting body (connecting body)
71 Second head part (head part)
72 Second pillar part (pillar part)
79 Fitting part
80 Connection terminal
100 Chip module
150 Chip connecting body

The invention claimed is:

1. An electronic module comprising:
   a first substrate;
   a second substrate provided in one side of the first substrate; and
   a chip module provided between the first substrate and the second substrate,
   wherein the chip module comprises an electronic element and a connecting body electrically connected to the electronic element,
   the electronic element is configured to extend along a first direction that is a thickness direction of the electronic module, and
   the connecting body is configured to extend along a second direction being orthogonal to the first direction and being an in-plane direction of the electronic module.

2. The electronic module according to claim 1, wherein the chip module comprises a first electronic element and a second electronic element connected to the first electronic element via the connecting body.

3. The electronic module according to claim 1, wherein the connecting body comprises a first connecting body and a second connecting body, and
   the chip module comprises a first electronic element, a second electronic element, the first connecting body provided between the first electronic element and the second electronic element, and the second connecting body provided in an opposite side of the second electronic element from the first connecting body.

4. The electronic module according to claim 1, wherein
the connecting body comprises a head part and a pillar part extending from the head part in a thickness direction of the head part and
the head part is configured to extend in the thickness direction of the electronic module.

5. The electronic module according to claim 1, wherein
a plurality of chip modules are provided, and
a chip connecting body electrically connected to the chip modules is provided between the chip modules.

6. The electronic module according to claim 5, wherein
a chip module comprises a fitting part to be fitted to the chip connecting body.

7. The electronic module according to claim 1 further comprising:
a first conductor layer provided in one side of the first substrate; and
a second conductor layer provided in another side of the second substrate; wherein
the connecting body comprises a connection terminal connecting the electronic element to each of the first conductor layer and the second conductor layer, and
either one of the first conductor layer and the second conductor layer connected to the connection terminal is not electrically connected to an external device.

8. The electronic module according to claim 1 further comprising:
a first conductor layer provided in one side of the first substrate; and
a second conductor layer provided in another side of the second substrate, wherein
the connecting body comprises a head part, a first base end part extending from an end part of the head part along an in-plane direction of the first substrate and connected to the first conductor layer, and a second base end part extending from an end part of the head part along an in-plane direction of the second substrate and connected to the second conductor layer, and
a direction in which the first base end part extending from an end of the head part and a direction in which the second base end part extending from an end of the head part are configured to not overlap in an in-plane direction of the electronic module including a second direction and a third direction.

9. The electronic module according to claim 8, wherein
the direction in which the first base end part extending from the end of the head part and the direction in which the second base end part extending from the end of the head part are different by 180 degrees.

* * * * *